United States Patent [19]

Schiewe

[11] Patent Number: 5,652,747

[45] Date of Patent: Jul. 29, 1997

[54] OPTICAL DISK RECORDING METHOD HAVING DURATION RATIO BETWEEN HIGH AND LOW LEVELS DURING FORMATION OF PITS

[76] Inventor: Hilmar Schiewe, Im Wöstenbusch 2, 33332 Gütersloh, Germany

[21] Appl. No.: 406,871

[22] PCT Filed: Jul. 6, 1994

[86] PCT No.: PCT/EP94/02209

§ 371 Date: May 11, 1995

§ 102(e) Date: May 11, 1995

[87] PCT Pub. No.: WO95/06943

PCT Pub. Date: Mar. 9, 1995

[30] Foreign Application Priority Data

Sep. 2, 1993 [DE] Germany ............ 43 29 712.9

[51] Int. Cl.⁶ .................... G11B 7/24; G03C 5/00
[52] U.S. Cl. ............ 369/275.4; 369/116; 430/321
[58] Field of Search ............ 369/275.4, 275.1, 369/59, 116, 13, 277, 278, 279, 272, 273, 276, 84; 430/320, 321; 428/64.1, 64.2, 64.4

[56] References Cited

U.S. PATENT DOCUMENTS

| | | | |
|---|---|---|---|
| 4,896,313 | 1/1990 | Hirose | 369/275.4 |
| 5,309,424 | 5/1994 | Ogawa | 369/116 |
| 5,327,414 | 7/1994 | Makino et al. | 369/116 |
| 5,428,594 | 6/1995 | Izumi et al. | 369/116 |
| 5,517,481 | 5/1996 | Kobayashi | 369/59 |

FOREIGN PATENT DOCUMENTS

| | | |
|---|---|---|
| A 0 081 649 | 6/1983 | European Pat. Off. |
| 35 04 969 | 8/1985 | Germany . |
| A 01 162 254 | 6/1989 | Japan . |
| A 5 135 412 | 6/1993 | Japan . |

*Primary Examiner*—Tan Dinh

[57] ABSTRACT

An improved CD mastering process enables an intentional deviation from the generally met symmetry condition of the lengths of same pits and lands, e.g. for test purposes, by making the ratio between the duration of the H-level and the duration of the L-level of the control signal for the laser beam exposing the master at least temporarily different from the value 1.0. A further development of the process enables to modify the width and/or the flank steepness of the pits independent from each other and independent from the pit length by simultaneously influencing the development time of the photosensitive coating being exposed.

8 Claims, 2 Drawing Sheets

OPTICAL DISK RECORDING METHOD HAVING DURATION RATIO BETWEEN HIGH AND LOW LEVELS DURING FORMATION OF PITS

BACKGROUND OF THE INVENTION

The invention refers to a method for making a master usable for replication of optical storage media of the CD type and including a flat substrate and a photosensitive coating having tracks produced with depressions, the so-called pits, the length of which as measured in track direction, and the mutual distance of which, the so-called lands, representing binary coded data. This generally known process includes i.a. the following steps:

The photosensitive coating is exposed trackwise to a laser beam which is activated by the H-level of a control signal and cut by its L-level; the control signal is the electrical image of a serial, binary data flow containing the data being stored.

The substrate is developed until the photosensitive coating includes depressions at the exposed spots The development is terminated as soon as the depressions corresponding to the H-levels of the control signal reach a mean volume which equals a given value.

In this process, the control signal generally designated as MTF signal is received from an encoder and transmitted to a laser beam recorder. The encoder converts the data to be stored, e.g. a PCM-coded audio signal, in accordance to the cross interleave Reed-Salomon code with subsequent eight-to-fourteen modulation and addition of control bits and synchronizing bits into the MTF signal which has a so-called channel-bit frequency of few megahertz, currently 4,3218 MHz and includes only nine discrete values of the pulse duration and pulse pause which leads accordingly to the generation of nine different pit lengths and land lengths upon the master. Since the pits and the lands are equivalent and defined as logic value zero while the transitions from pit to land and from land to pit represent the logic one and since in the context of mastering the generation and configuration of the pits constitutes the crucial step, the subsequent data are based upon the pits. The nine pits of different duration and accordingly different lengths are designated as I3 pits to I11 pits. Calculated from the above stated channel bit frequency as reciprocal value is the pit cycle of 231.39 ns and thus the duration of I3 pits as 3×231.39 ns=694 ns as well as the duration of the I11 pit as 11×231.39 ns=2545 ns.

In order to keep the channel-bit frequency constant, the speed of the master is respectively readjusted during exposure of the master from inside towards the outside. Taking into consideration the currently common storage media of the CD type with a track readout speed of either 1.2 m/s or 1.4 m/s, the speed thus varies between the smallest and the greatest exposed radius of the master either from 486 to 196 rpm (for 1.2 m/s) or from 568 to 228 rpm (for 1.4 m/s). Considering the above stated time periods, the smallest length of a I3 pit for the smaller track read out speed is calculated as 0.833 µm and the greatest length of a I11 pit for the greater track read out speed is calculated as 3.563 µm.

The complex coding process resulting in the MTF signal provides i.a. that this MTF signal is equivalent-free which means that its time-base mean value (based on alternating current) equals zero. In order to meet the same condition for the MTF signal generated by the respective optical storage medium during readout, the I3 pits to I11 pits must have the same geometric lengths as the corresponding I3 lands to I11 lands upon the optical storage medium produced from the exposed master through several, conventional intermediary steps. To attain this, it is necessary to precisely control the development process and to terminate (abort) when the pits have reached a length at which empirically the above stated symmetry condition is met for the finished storage medium, designated short as symmetry =0. Since the length of the pits cannot be directly measured, instead a certain area of the master is illuminated during developing and in the reflected defraction pattern the intensity of the maximum zero order is compared with the one of the maximum of the first order, which as a result corresponds to a measurement of the mean volume of the pits in the illuminated area of the master. When the measured ratio reaches a preset value, the development is aborted.

The development process and the dimensions of the pits produced thereby depend on numerous parameters, e.g. on the electric and optical tolerances of the laser beam recorder, on the composition and the layer thickness of the photosensitive coating and on the aftertreatment of the master. In case, these parameters require a relatively long time for development until fulfilling the symmetry condition, the produced pits are relatively wide and have steep flanks. In the reversed case, a brief time for development results in narrow pits with flat flanks. This correlation is known, compare DE-C2-29 35 789. Through modification of the numerical aperture of the exposing laser beam, the pit width (and simultaneously to a very small degree also the pit length) may be influenced since a great numerical aperture results in a small pit width, and vice versa. However, there is no possibility to targetly influence the steepness of the flanks of the pits. It follows thereby that steep flanks result during readout of a storage medium replicated from such a master in better detectable and in zero/one transitions which are based on time more exactly positioned, and thus leads to a lower block error rate as well as to a lower data jitter while flat flanks improve the molding capability and possibly facilitate the track tracing during readout.

SUMMARY OF THE INVENTION

The invention is based first upon the object to modify the previously described, known process in such a manner that the storage medium replicated from the master has at least a certain number of pits and lands which do not meet the condition symmetry =0 but includes either too short pits and accordingly too long lands (positive symmetry) or too long pits and accordingly too short lands (negative symmetry).

This object is attained according to the present invention by making the ratio V between the duration of the H-level and the duration of the L-level of the control signal at least temporary different from the value 1.0, with the duration of the H-level and the one of the L-level being altered not by a constant factor but shortened or extended by an absolute amount. In case this shortening or extension amounts to for example 100 ns, a symmetry ratio of 0.85 and 1.15, respectively, is obtained for the I3 pits and the I3 lands while a symmetry ratio of 0.96 and 1.04, respectively, is obtained for the I11 pits and the I11 lands (with respective intermediate values for the other pit lengths and land lengths). Such a storage medium is especially suitable for testing certain properties of read-out and/or measuring systems for storage media of the CD type.

The stated ratio V lies preferably in an area, having a lower limit value corresponding to a shortening of the duration of all H-levels by the duration of the H-level producing the shortest pits, and an upper limit value corresponding to an extension of the duration of all H-levels by the same duration. This means that the I3 pits disappear at the lower limit value while the I3 lands disappear at the upper limit value.

The ratio V may also be modified during exposure of the photosensitive coating according to the scanning values of an information signal. Through respective signal processing during readout of a storage medium replicated from such a described master, the information signal modulating the ratio V can be recovered. This requires a special readout device, however, the ratio V can be varied in a time domain or locally upon the storage medium in such a manner that the readout capability of the storage medium is not adversary affected by a normal readout device e.g. a commercially available CD player. The information signal modulating the ratio V can include e.g. a manufacturer's identification and thus provides the original storage media with a feature that is only very difficult to imitate by product pirates.

The modulation of the ratio V is particularly simple when the information signal is a binary coded signal.

Overall, the proposed modification of the known process enables to targetly modify the symmetry of the pits and lands of the replicated storage medium in very broad ranges without changing the pit width and/or flank steepness of the pits.

Building upon this proposal, the invention is based upon the further object to improve the known process in such a manner that the width and/or flank steepness of the pits can be modified independently from each other and, above all, independently from the pit length, assuming the normal case in which the I3 pits to I11 pits have fixed preset lengths, namely those which meet the condition symmetry =0 in replicated storage media.

This further object is attained according to the invention by making the ratio V between the duration of the H-level and the duration of the L-level of the control signal smaller than 1.0, and by extending the development time by such an amount that the mean length of the depressions in the replicated storage medium again equals the mean length of their mutual distances.

This process enables to increase the flank steepness and pit width without violating the symmetry condition when the known process results in too narrow pits with too small flank steepness because the prolongation of the development time leads to pits with steeper flanks and greater widths.

As long as the pits produced according to the conventional processes have a width corresponding to a predetermined desired value and only a flank steepness that is too small, an undesired widening of the pits can be prevented with the proposed process by increasing the numeric aperture of the laser beam to a value at which the width of the pits does not exceed the preset desired value at the moment of abortion the development process.

In the reversed case, if the know process results in pits with too great flank steepness and/or too great width, both these parameters can be reduced together or independently from each other to the desired value.

This is attained by making the ratio V between the duration of the H-level and the duration of the L-level of the control signal greater than 1.0, and by shortening the development time by such an amount that the mean length of the depressions in the replicated storage medium again equals the mean length of their mutual distances.

If necessary, also the numeric aperture of the laser beam is reduced to a value at which the pit width does not fall below a preset desired value.

BRIEF DESCRIPTION OF THE DRAWING

The proposed process will now be described in more detail with reference to the drawing.

DETAILED DESCRIPTION OF PREFERRED EMBODIMENTS

Figure 1:
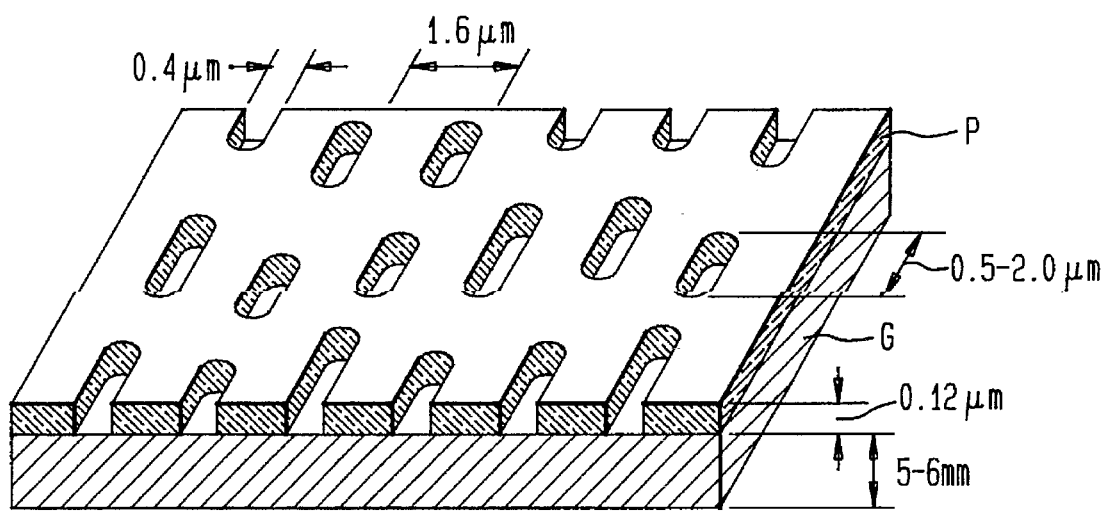
FIG. 1 shows a perspective illustration of a section from an exposed and developed glass master of the CD type.

FIG. 1 shows a perspective illustration of a section from an exposed and developed glass master of the CD type, with G designating the glass substrate while P refers to the photosensitive coating, the so-called photoresist. Further indicated are the most important geometrical dimensions.

Figure 2:
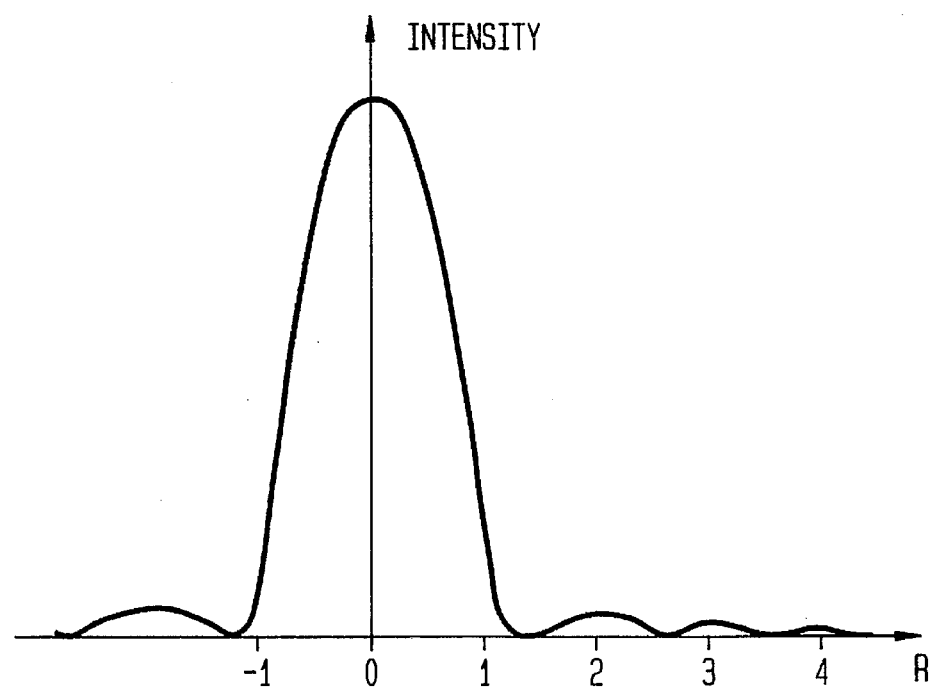
FIG. 2 shows the intensity profile of the laser spot of the laser beam recorder used for exposing the glass master according to FIG. 1.

FIG. 2 shows the intensity profile of the laser spot of the laser beam recorder used for exposing the glass master according to FIG. 1 This intensity profile which follows the function sin x/x is i.a. the reason that the length, the width and the flank steepness of the pits increase with increasing development time.

Figure 3A:
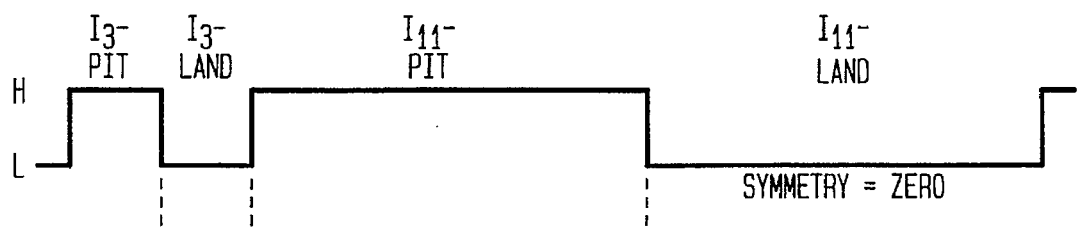
FIGS. 3a, 3b, 3c show three time-dependent diagram of a MTF signal controlling the laser beam recorder for exposure of the glass master with the sequence of a I3 pit, a I3 land, a I11 pit and a I11 land.
Figure 3B:
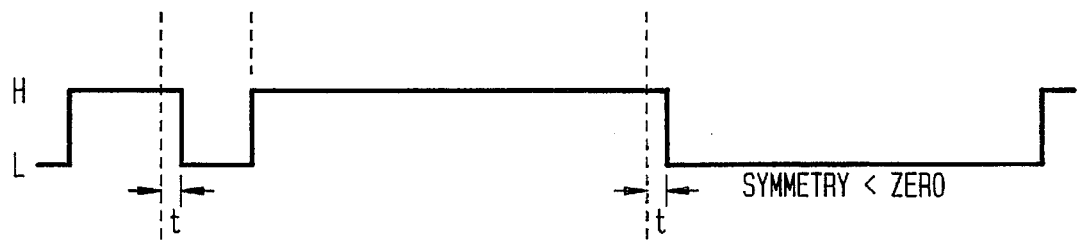
Figure 3C:
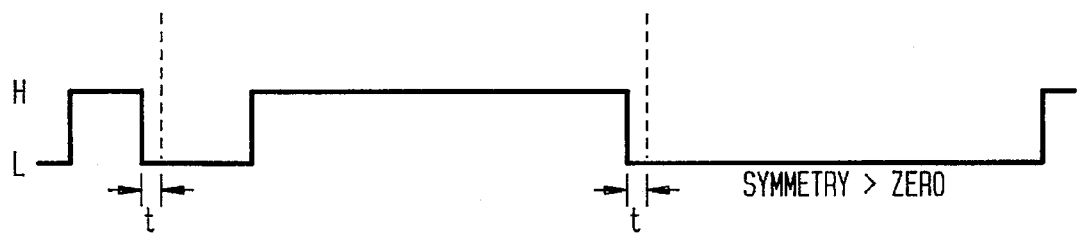

FIG. 3a–3c shows beneath each other three time-dependent diagrams of a MTF signal controlling the laser beam recorder for exposure of the glass master with the sequence of a I3 pit, a I3 land, a I11 pit and a I11 land. The uppermost diagram depicts the MTF signal used in the hitherto conventional process which, based on alternating current, is equivalent-free. The middle diagram shows the situation of the so-called negative symmetry in which the duration of the pulses which record the pits is extended by a constant time interval t and the pulse pauses which correspond to the lands are shortened by the same time interval. The third diagram shows the reversed situation of the so-called positive symmetry.

Figure 4:
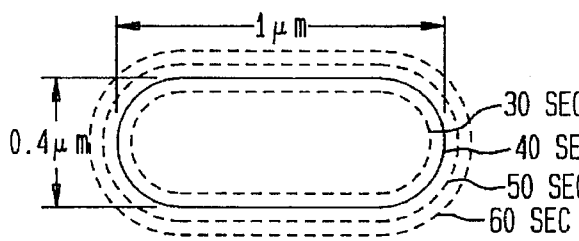
FIG. 4 is a schematic plan view, enlarged by about a scale of 1:50,000, of a standard pit, made through a conventional process.
Figure 5:
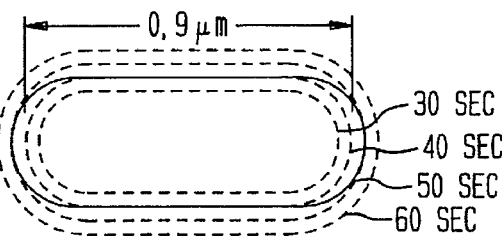
FIGS. 5 and 6 are each a schematic plan view, enlarged by about a scale of 1:50,000, of a pit made through a process according to the present invention.
Figure 6:
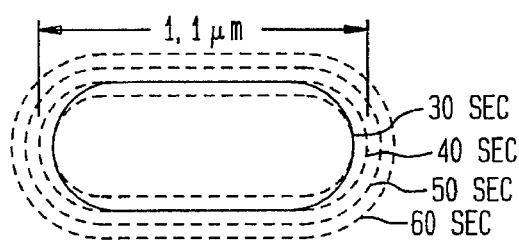

FIGS. 4, 5 and 6 are schematic plan views, enlarged by about a scale of 1:50, 000 of a pit having standard dimensions of a length of 1 μm and a width of 0.4 μm, illustrated by the continuous line. The dashed contours show the outlines of pits which, as shown by the respective contours, would result during shorter or longer development times as the one which is associated to the respective continuous line.

For the pit according to FIG. 4 and produced according to the conventional process, the correlation of the following table governs for the condition symmetry =0.

| Exposure | Development normal 40 sec. | Under- developmt. 30 sec. | Over- developmt. 50 sec. | Over- developmt. about 60 sec. |
|---|---|---|---|---|
| Pit length 1 μm | 1 μm | 0.9 μm | 1,1 μm | 1,2 μm |
| Pit width 0.4 μm | 0.4 μm | 0.3 μm | 0,5 μm | 0,6 μm |

FIG. 5 shows the case for a pit recorded with a MTF signal having positive symmetry, and the correlation shown in the following table governs:

| Exposure | Development normal 40 sec. | Under-developmt. 30 sec. | Over-developmt. 50 sec. | Over-developmt. approx. 60 sec. |
|---|---|---|---|---|
| Pit length 0.9 μm | 0.9 μm | 0.8 μm | 1 μm | 1,1 μm |
| Pit width 0.4 μm | 0.4 μm | 0.3 μm | 0,5 μm | 0,6 μm |

FIG. 6 shows the case for a pit recorded with a MTF signal with negative symmetry, and the correlation illustrated in the following table governs:

| Exposure | Development normal 40 sec. | Under-developmt. 30 sec. | Over-developmt. 50 sec. | Over-developmt. ca. 60 sec. |
|---|---|---|---|---|
| Pit length 1.1 μm | 1.1 μm | 1 μm | 1,2 μm | 1,1 μm |
| Pit width 0.4 μm | 0.4 μm | 0.3 μm | 0,5 μm | 0,6 μm |

As the comparison of FIGS. 4 to 6 and the pertaining tables clearly show, the process according to the invention enables the production of pits with a predetermined length, namely the length required for maintaining the condition symmetry =0 upon the replicated storage medium, by changing the symmetry of the MTF signal that controls the laser beam recorder with varying width. Not shown in the drawing is the flank steepness which however increases approximately proportional with the width.

In FIGS. 4 to 6, the dependency of the pit dimensions from the development time is shown in a simplified manner as linear. In reality, as known per se, there is a non-linear correlation.

I claim:

1. Method for making a master disk for replication of optical storage media based on CD technology and including a flat substrate and a photosensitive coating having tracks produced with depressions, the so-called pits, the length of which as measured in track direction, and the mutual distance of which, the so-called lands, representing binary coded data, said method comprising the steps of:

exposing tracks of the photosensitive coating to a laser beam which is activated by the H-level of a control signal and cut by its L-level, with the control signal being the electrical image of a serial, binary data flow containing the data being stored, developing the substrate until the photosensitive coating includes depressions at the exposed spots, terminating the development as soon as the depressions corresponding to the H-levels of the control signal reach a mean volume which equals a given value, wherein the duration of all H-levels varies by a particular amount from the duration of the respective L-levels of the control signal.

2. The method according to claim 1 wherein the particular amount is defined in a range between a lower limit value corresponding to a shortening of the duration of all H-levels by the duration of the H-level producing the shortest pits, and an upper limit value corresponding to an extension of the duration of all H-levels by the same duration.

3. The method according to claim 1 wherein the particular amount is modified during exposure of the photosensitive coating according to the scanning values of an information signal.

4. The method according to claim 3, wherein the information signal is a binary coded signal.

5. Method for making a master disk for replication of optical storage media based on CD technology and including a flat substrate and a photosensitive coating having tracks produced with depressions, the so-called pits, the length of which as measured in track direction, and the mutual distance of which, the so-called lands, representing binary coded data, said method comprising the steps of:

exposing tracks of the photosensitive coating to a laser beam which is activated by the H-level of a control signal and cut by its L-level, with the control signal being the electrical image of a serial, binary data flow containing the data being stored, developing the substrate until the photosensitive coating includes depressions at the exposed spots, terminating the development as soon as the depressions corresponding to the H-levels of the control signal reach a mean volume which equals a given value, wherein the duration of all H-levels is reduced by a particular amount from the duration of the respective L-levels of the control signal, and wherein the development time is extended by such an amount that a mean length of the depressions in the replicated storage medium again equals the mean length of their mutual distances.

6. The method according to claim 5 wherein the numeric aperture of the laser beam is increased to a value as to prevent the width of the pits from exceeding the preset desired value.

7. Method for making a master disk for replication of optical storage media based on CD technology and including a flat substrate and a photosensitive coating having tracks produced with depressions, the so-called pits, the length of which as measured in track direction, and the mutual distance of which, the so-called lands, representing binary coded data, said method comprising the steps of:

exposing tracks of the photosensitive coating to a laser beam which is activated by the H-level of a control signal and cut by its L-level, with the control signal being the electrical image of a serial, binary data flow containing the data being stored, developing the substrate until the photosensitive coating includes depressions at the exposed spots, terminating the development as soon as the depressions corresponding to the H-levels of the control signal reach a mean volume which equals a given value, wherein the duration of all H-levels is reduced by a particular amount from the duration of the respective L-levels of the control signal, and wherein the development time is shortened by such an amount that a mean length of the depressions in the replicated storage medium again equals the mean length of their mutual distances.

8. The method according to claim 7 wherein the numeric aperture of the laser beam is reduced to a value as to prevent the pit width from falling below a preset desired value.

* * * * *

UNITED STATES PATENT AND TRADEMARK OFFICE
CERTIFICATE OF CORRECTION

PATENT NO. : 5,652,747
DATED : July 29, 1997
INVENTOR(S) : Hilmar Schiewe

It is certified that error appears in the above-identified patent and that said Letters Patent is hereby corrected as shown below:

Column 1, line 34, change "4,3218" to --4.3218--;
Column 3, line 67, add after "drawing" --in which--;
Claim 7, column 6, line 56, change "reduced" to --increased--

Signed and Sealed this

Thirteenth Day of January, 1998

Attest:

BRUCE LEHMAN

Attesting Officer        Commissioner of Patents and Trademarks